United States Patent [19]

Suski

[11] Patent Number: 5,565,896
[45] Date of Patent: Oct. 15, 1996

[54] TERMINATION CIRCUIT FOR RGB LINES

[75] Inventor: Edward D. Suski, Lake Forest, Calif.

[73] Assignee: AST Research, Inc., Irvine, Calif.

[21] Appl. No.: 610,692

[22] Filed: Mar. 4, 1996

Related U.S. Application Data

[63] Continuation of Ser. No. 247,580, May 23, 1994, abandoned.

[51] Int. Cl.⁶ .............................. G09G 5/12; H03H 7/40
[52] U.S. Cl. ............................................. 345/211; 333/32
[58] Field of Search ................................ 345/1, 2, 211, 345/212, 213; 333/22 R, 32, 33, 172

[56] References Cited

U.S. PATENT DOCUMENTS

| | | | |
|---|---|---|---|
| 3,456,206 | 7/1969 | Kwartiroff et al. | 333/32 |
| 4,612,576 | 9/1986 | Hinn | 348/687 |
| 4,908,842 | 3/1990 | Collins | 345/213 |
| 5,208,562 | 5/1993 | Schirm, IV | 333/22 R |
| 5,285,197 | 2/1994 | Schmidt et al. | 345/213 |

Primary Examiner—Jeffery Brier
Attorney, Agent, or Firm—Knobbe, Martens, Olson & Bear

[57] ABSTRACT

A termination circuit for RGB signal lines provides a high frequency termination impedance that matches the impedance of a monitor cable and monitor termination, without adversely affecting the monitor-sense circuitry of an ASIC that generates the RGB video signals. When used with a VGA ASIC designed to work with 150 Ω pull-down sense resistors on the RGB lines, the circuit provides the proper 75 Ω AC termination impedance required for VGA lines while producing the 150 Ω DC termination required for proper monitor sense operation.

20 Claims, 4 Drawing Sheets

TERMINATION CIRCUIT FOR RGB LINES

This application is a continuation of U.S. Pat. application Ser. No. 08/247,580, filed May 23, 1994, now abandoned.

FIELD OF THE INVENTION

This invention relates to transmission lines and associated circuitry for providing computer video signals to a monitor. In particular, this invention relates to termination circuits for RGB signal lines that connect a Video Graphics Array (VGA) chip to a monitor.

BACKGROUND OF THE INVENTION

Personal computers (PCs) that support the various Video Graphics Array (VGA) display modes commonly use a commercially available VGA application specific integrated circuit (VGA ASIC) to generate video signals from data stored in video memory. The VGA ASIC outputs three analog video signals, one for each of the colors red, green and blue. The red, green and blue output signals are provided on a set of RGB lines that connect the RGB pins of the VGA ASIC to a standard 15-pin display connector. The red, green and blue video signals are passed to a color monitor via a monitor cable, and control the red, green and blue electron beams of the monitor. When a monochrome monitor is connected to the PC, only the green signal is passed to the monitor (i.e., no connection is made between the monitor and the red and blue signal lines).

Commercially available VGA ASICs normally support one or more display modes that are compatible with monochrome monitors. To permit automatic selection of an appropriate display mode, a monitor-sense circuit is included within the VGA ASIC. The monitor-sense circuit determines the monitor type (typically following a system reset) by effectively measuring the DC resistance on each of the RGB signal lines. This is done by placing a known DC current on each RGB line and measuring the DC voltage on the line. Alternatively, the monitor-sense circuit may place a known DC voltage on each line and measure the resulting current. When an RGB line from the ASIC is not connected to the monitor (as is the case for the red and blue RGB lines when a monochrome monitor is connected to the PC), the DC resistance measured by the monitor-sense circuit is equal to the resistance of a termination resistor connected at the PC end (or "ASIC end") of the RGB line. When the RGB line is connected to a monitor, the DC resistance seen by the monitor-sense circuit is approximately equal to the resistance of the termination resistor at the ASIC end in parallel with a termination resistor at the monitor end. The monitor-sense circuit can thus determine which, if any, of the RGB lines from the ASIC are connected to a monitor, and thus determine whether a monitor is monochrome or color. Once this determination is made, a BIOS routine or dedicated hardware can be used to select an appropriate display mode.

By definition, VGA lines are 75 Ω transmission lines. Thus, in order to match the AC impedances of both the VGA monitor cable and the termination at the monitor end, each RGB line must have a 75 Ω termination at the ASIC end. A number of VGA chip manufacturers, however, have erroneously designed their VGA ASICs to work with 150 Ω current sense pull-down resistors on the RGB lines. According to "engineering folklore," this design error is the result of a mistake made by IBM in the early 1980s, in which IBM used 150 Ω termination resistors on a VGA video board schematic. The error was quickly copied by the industry, and remains as a feature of a variety of commercially available VGA ASICs.

Failure to use 150 Ω pull-down termination resistors with these erroneously designed ASICs can cause the monitor-sense circuit to fail by affecting the DC current or voltage induced during the monitor sense operation. Personal computer manufacturers that use these ASICs have therefore chosen to use the recommended 150 Ω pull-down resistors on the RGB lines to assure that the ASIC will correctly sense the monitor type, ignoring the impedance discontinuity that results on each RGB line. These impedance discontinuities cause signal reflections that reduce the quality of the color signals received by the monitor. The impedance discontinuities also increase the radiated emissions from the RGB lines.

SUMMARY OF THE INVENTION

The present invention is directed to an RGB termination circuit that solves the above-described problem. The circuit effectively connects a second 150 Ω resistor in parallel with each of the 150 Ω termination resistors at high frequencies using diodes (such as the Motorola MBRS170T3) which approximate short circuits at such frequencies. A high frequency impedance equal to 75 Ω (i.e., the parallel combination of the two 150 Ω resistors) is thereby obtained, while maintaining the 150 Ω DC termination required by the monitor-sense circuit.

In accordance with one embodiment of the invention, there is thus provided a termination circuit for an RGB signal line from an ASIC, comprising a first resistor connected between the signal line and ground, and a series combination of a second resistor and a diode connected between the signal line and AC ground (i.e., a node that is effectively shorted to ground at high frequencies). The first resistor has a resistance that falls within a range necessary for the proper operation of the monitor-sense circuit. This first resistor is equivalent to the prior art termination resistor. The second resistor has a resistance such that, when the first and second resistors are connected in parallel, the resistance of the parallel combination is approximately equal to the AC impedance of the signal line.

The diode remains reverse biased when the monitor-sense circuit senses the monitor type, so that substantially no DC current flows through the second resistor. This allows the monitor-sense circuit to operate properly. During the normal transmission of video signals, the diode approximates a short circuit with respect to the high frequency components of the signal, effectively connecting the second resistor in parallel with the first resistor. A high frequency impedance that matches the AC impedance of the signal line is thus obtained. A significant improvement in signal quality and a reduction in radiated emissions is thereby obtained over the prior art.

In an alternative embodiment of the termination circuit, two series diode-resistor pairs are used with each RGB signal line. The first diode-resistor pair is connected between the signal line and ground (in parallel with the prior art termination resistor). The second resistor-diode pair is connected between the signal line and a positive voltage source. The resistors of the resistor-diode pairs have resistances such that, when all three resistors of the circuit are connected in parallel, the resistance of the parallel combination is approximately equal to the AC impedance of the signal line. The positive voltage source is connected to ground by one or more filter capacitors, and is thus effectively shorted to ground with respect to high frequency signal components.

The two diodes remain reverse biased when the ASIC senses the monitor type, preventing current from flowing through the respective resistors to which the diodes are series connected. During the transmission of video signals, the two diodes approximate short circuits with respect to high frequency components, producing a high frequency impedance approximately equal to the parallel combination of the three resistors. A high frequency impedance that matches the AC impedance of the signal line is thus obtained.

BRIEF DESCRIPTION OF THE DRAWINGS

In the drawings, the first digit of a reference number indicates the figure number in which the element is first shown. Additionally, like reference numbers indicate identical or functionally similar elements.

DETAILED DESCRIPTION OF THE INVENTION

Figure 1:
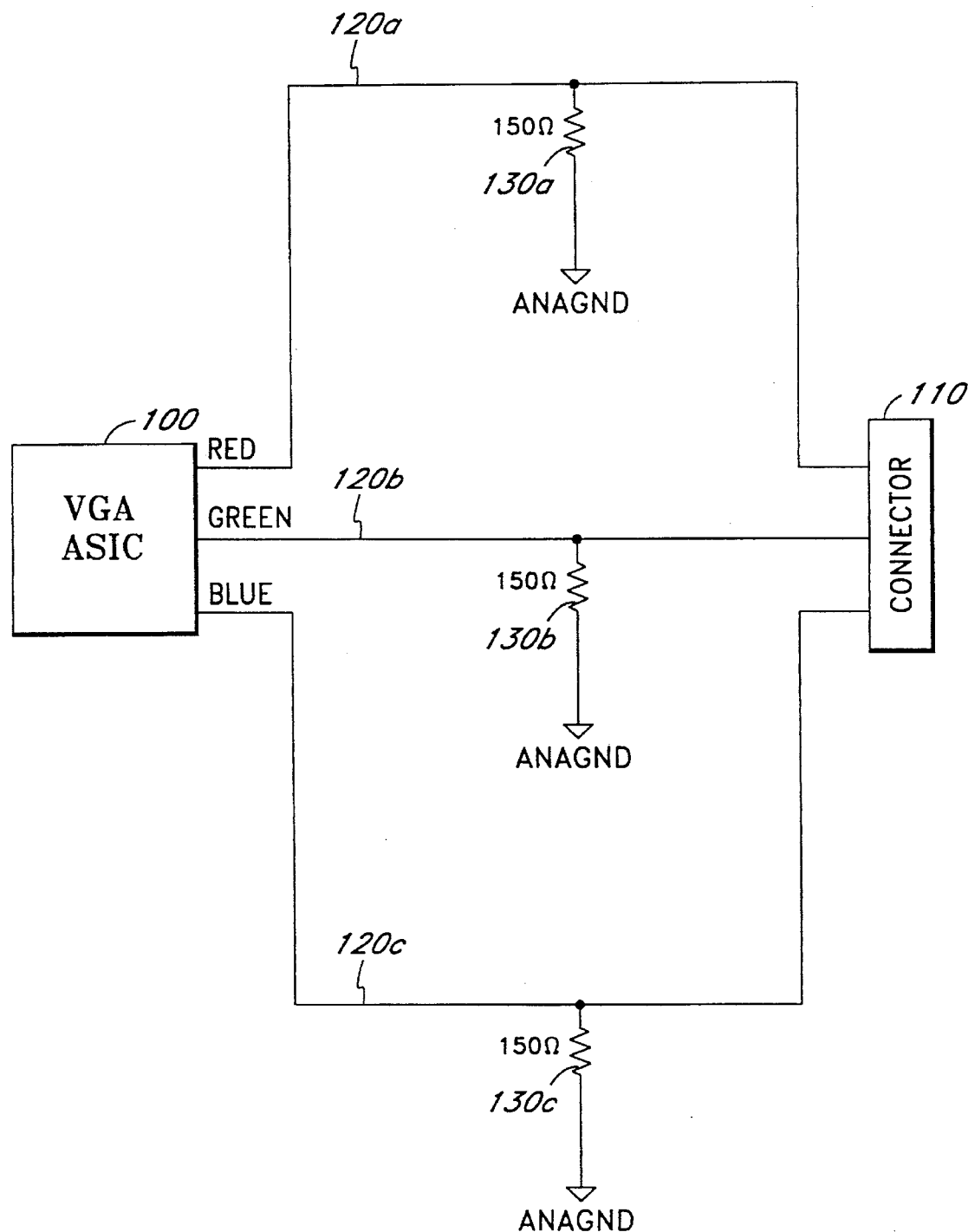
FIG. 1 is a circuit diagram illustrating a prior art RGB line termination circuit used with VGA ASICs that are design for use with 150 Ω pull-down sense resistors.

FIG. 1 illustrates a prior art termination circuit for a VGA ASIC 100 designed to operate with 150 Ω current sense resistors. The VGA ASIC 100 (hereinafter "ASIC") is connected to a standard IS-pin display connector 110 by RGB lines 120a, 120b and 120c that communicate the red, green and blue video signals respectively. Connections between the ASIC 100 and the connector 110 for the standard horizontal sync and vertical sync video signals are not shown.

Each RGB line 120a–120c is terminated at the ASIC 100 end with a 150 Ω pull-down termination resistor 130a–130c. The resistors 130a–130c are connected between the respective RGB lines 120a–120c and an analog ground (ANAGND). (Analog ground is a voltage level that is AC-isolated from the ground level used for logic signals). A monitor-sense circuit (not shown) of the ASIC 100 uses the resistors 130a–130c to determine the type of monitor connected to the display connector 110. If a monochrome monitor is connected to the display connector 110, for example, the ASIC 100 will sense a 150 Ω resistance on each of the red signal line 120a and the blue signal line 120c (since no connection is made by the monochrome monitor to these lines), but will sense a lower resistance on the green signal line 120b as that is approximately equal to the resistance of the parallel combination of the 150 Ω termination resistor at the ASIC end and a termination resistor (not shown) at the monitor end.

As described above, the 150 Ω resistors 130a–130c do not match the 75 Ω impedance of the VGA monitor cable and VGA monitor (cable and monitor not shown). This impedance discontinuity causes a degradation in the quality of the color signals, and increases radiated emissions. These adverse effects are greater with faster signal rise times on the RGB lines, and generally become a problem for signal edges of 2 ns (nano seconds) or less. Such edges are especially susceptible to reflection.

Although the impedance discontinuity could be cured by replacing the 150 Ω resistors 130a–130c in FIG. 1 with 75 Ω resistors, such a replacement would likely cause the monitor-sense circuit of the ASIC 100 to fail.

The present invention solves this problem by making use of the high frequency characteristics of certain types of diodes. Through experimentation with a time domain reflectometer (TDR), the inventor has discovered that certain fast diodes such as the Motorola MBRS170T3 effectively become short circuits at the edge rates for which the above-described impedance discontinuity becomes a concern. The present invention uses such diodes to effectively place a second resistor in parallel with each 150 Ω resistor 130a–130c at high frequencies, to thereby achieve the high frequency impedance of 75 Ω.

Figure 2:
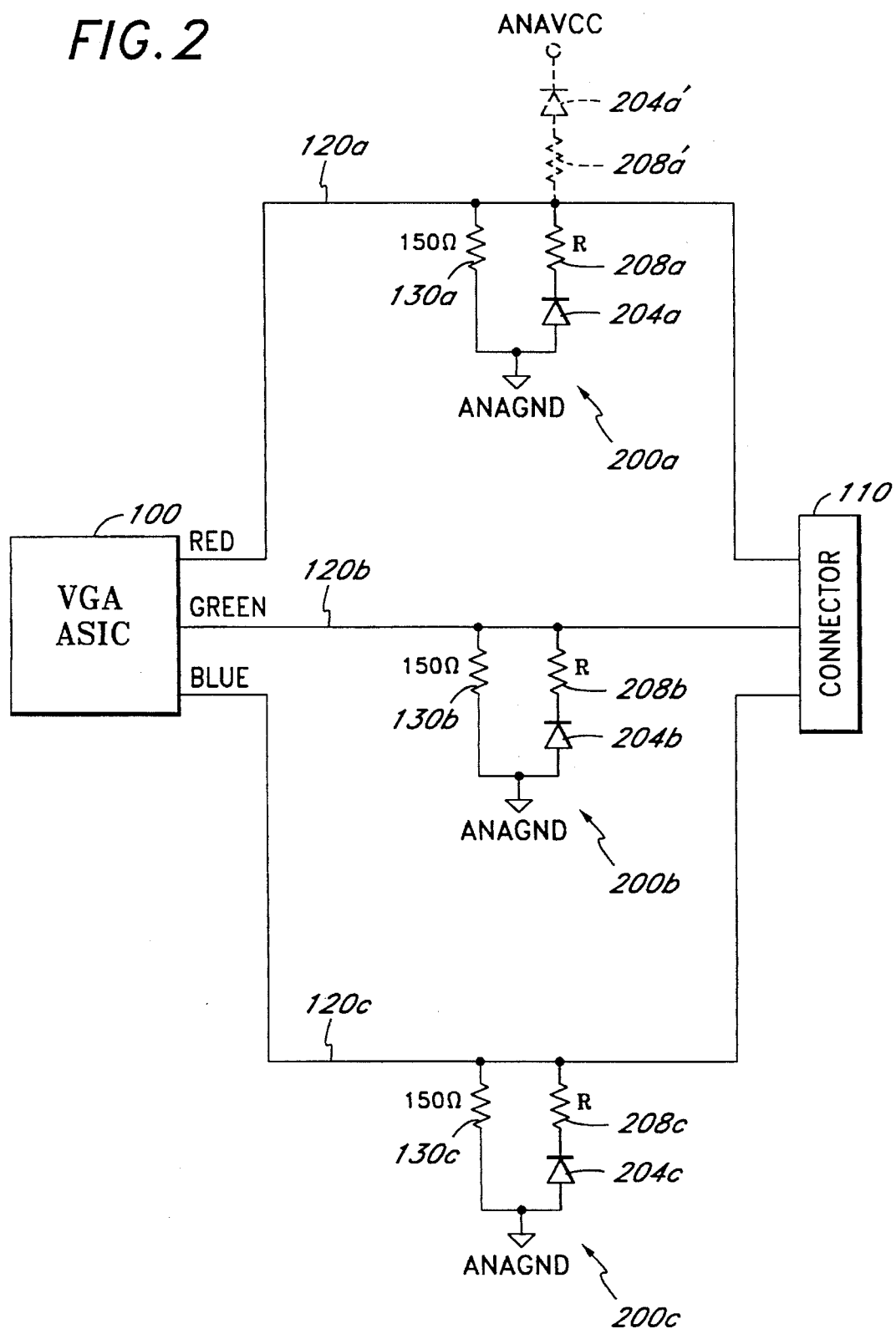
FIG. 2 illustrates an RGB line termination circuit in accordance with a first embodiment of the present invention.

FIG. 2 illustrates a first embodiment of an RGB line termination circuit that performs this function. The circuit comprises three identical termination circuits 200a, 200b, and 200c, one for each RGB signal line 120a, 120b and 120c. The termination circuit 200a for the red signal line 120a comprises the 150 Ω resistor 130a of FIG. 1 connected in parallel with a series combination of a diode 204a and a resistor 208a. The termination circuit 200b for the green signal line 120b comprises the 150 Ω resistor 130b connected in parallel with a series combination of a diode 204b and a resistor 208b. The termination circuit 200c for the blue signal line 120c comprises the 150 Ω resistor 130c connected in parallel with a series combination of a diode 204c and a resistor 208c.

The resistors 208a–208c each have a resistance of R. The diodes 204a–204c are preferably fast diodes such as the Motorola MBRS170T3, that approximate short circuits with respect to high frequency signal components associated with edge rates faster than 2 ns. For other applications of the termination circuits 200a–200c it may be desirable to select diodes that short circuit at higher or lower frequencies.

The operation of the termination circuits 200a–200c will now be described. To determine the type of monitor connected to the display connector 110, the monitor-sense circuit of the ASIC 100 senses the DC resistance on each RGB line 120a–120c by placing a DC current (or voltage) on each line 120a–120c while monitoring the DC voltage (or current) on each such line. The current flow is out of the ASIC 100 during this monitor sense operation. The diodes 204a–204c are thus reverse biased, and do not conduct enough current to affect the voltage or current sensed during the sensing operation. The ASIC 100 thus sees a DC termination resistance of 150 Ω on each of the lines 120a–120c, as required for proper sensing of the monitor type.

During the normal transmission of video signals, the diodes 204a–204c remain reverse biased; however, for high frequency components associated with sub 2 ns rise times, the diodes 204a–204c approximate short circuits. Thus, at such frequencies, the resistors 208a–208c are effectively in parallel with the respective 150 Ω resistors 130a–130c. The high frequency resistance $R_{HF}$ of each termination circuit 200a–200c is thus given by:

$$R_{HF} = \frac{150R}{(150 + R)} \qquad (1)$$

The desired termination impedance of $R_{HF}$=75 Ω can thus be obtained by using resistors 208a–208c that have a resistance of R=150 Ω each.

Certain types of diodes have a resistance $R_D$ that cannot be ignored over the range of high frequencies. For such diodes, $R_{HF}$ is given by:

$$R_{HF} = \frac{150(R + R_D)}{150 + (R + R_D)} \quad (2)$$

For this type of diode, the resistors 208a–208c should be selected such that $R+R_D=150\ \Omega$.

Time domain reflectometry measurements have been taken to verify that the circuit of FIG. 2 produces the desired 75 Ω termination impedance over the range of video signal frequencies for which signal reflection is a concern. A comparison of such measurements with TDR measurements for the prior art circuit of FIG. 1 indicates that a significant reflection is effectively eliminated by the addition of the series resistor-diode pairs of FIG. 2. A significant improvement in signal quality, in addition to a reduction in radiated emissions, can thus be obtained.

The use of diodes in the manner described above raises the question of whether the diodes 204a–204c could be replaced with capacitors that short out at the desired frequency. The problem with the use of capacitors for this purpose is that a capacitor will produce an impedance that varies above and below the capacitor's resonance frequency. This variable impedance makes it difficult to generate a 75 Ω termination impedance over the range of high frequencies of concern. Diodes of the type described above more-closely approximate a wire at such frequencies and are thus better-suited for the purpose.

It should be noted that it is not essential to the present invention to use an analog ground that is AC isolated from the ground used for digital logic circuitry. The use of an analog ground, however reduces interference in the video signals that can be caused by the switching of digital logic circuitry.

Referring to FIG. 2, it should also be noted that it is not essential for the series resistor-diode pairs to be connected to ANAGND. Rather, each pair can be connected between the respective signal line 120a–120c and any AC ground (i.e., any node that is effectively connected to ANAGND or ground at high signal frequencies). An example of an alternative connection of a resistor-diode pair is illustrated in phantom in FIG. 2. A diode 204a' and a resistor 208a' are shown as connected in series between the signal line 120a and analog VCC (ANAVCC), as an alternative connection of the diode 204a and the resistor 208a. The analog VCC is a positive DC voltage, such as, for example, 5 volts, and is AC-isolated from a VCC voltage source used for digital logic circuitry in the computer system. It may be assumed that the monitor-sense circuit of the ASIC 100 does not induce a DC voltage on the line 120a that is greater than ANAVCC plus the forward bias voltage of the diode 204a', so that the diode 204a' is reverse biased during the monitor sense operation. In this alternative embodiment, ANAVCC and ANAGND are connected by filter capacitors (not shown) that short circuit at high frequencies. Thus, ANAVCC is an AC ground, and the resistors 208a' and 130a are effectively connected in parallel at high signal frequencies for which the diode 204a' and the filter capacitors effectively become short circuits. This alternative connection thus achieves the objective of connecting the resistor 208a' in series with the resistor 130a at high frequencies, without adversely affecting the operation of the monitor-sense circuit.

An alternative embodiment of the present invention will now be described, which adds an additional resistor-diode pair to each termination circuit 200a–200c of FIG. 2 to provide ESD protection to the ASIC 100. To fully appreciate the benefits of this alternative embodiment, the prior art termination circuit shown in FIG. 3 will initially be described.

Figure 3:
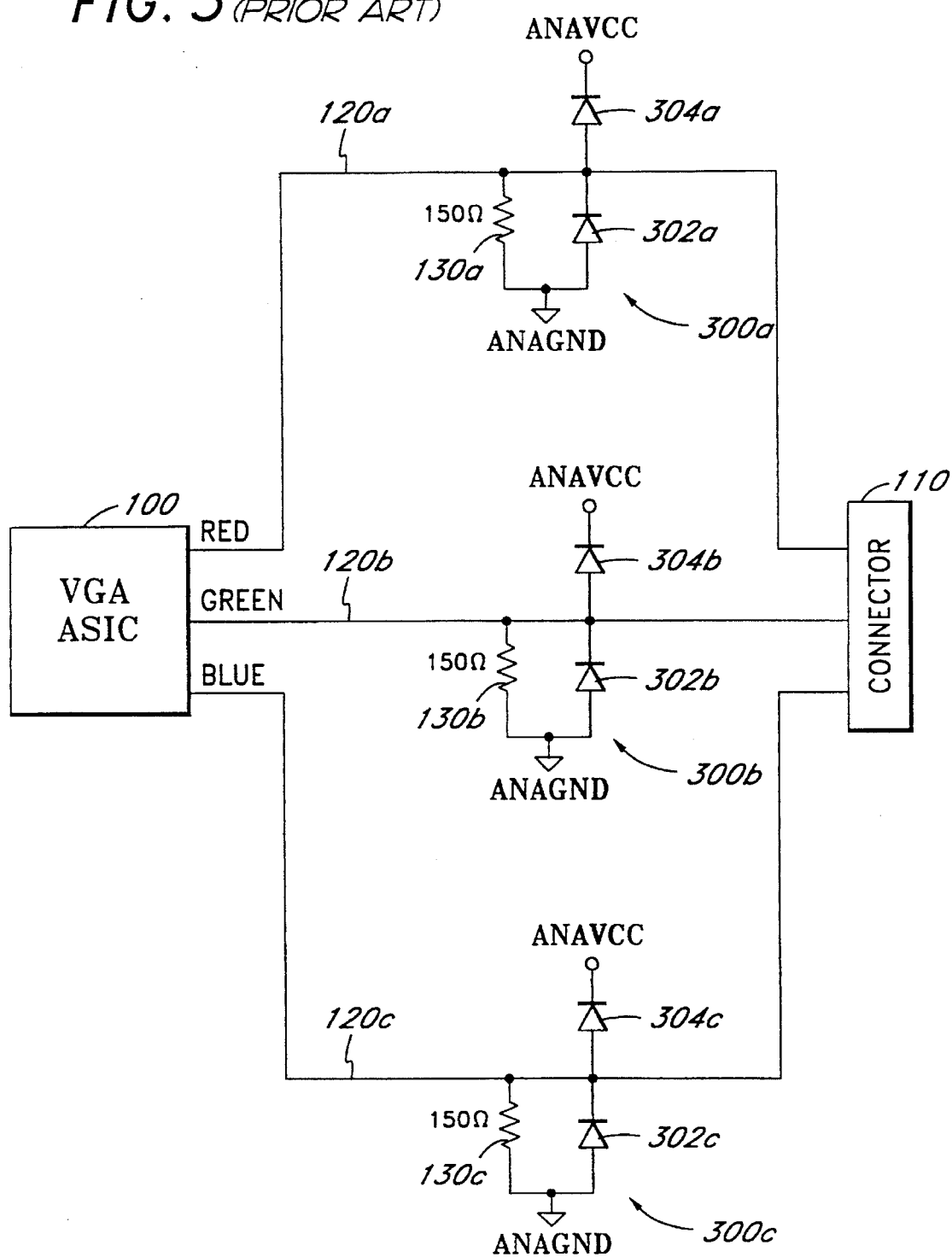
FIG. 3 illustrates a prior art RGB line termination circuit that includes clamping diodes to provide electrostatic discharge (ESD) protection.

Referring to FIG. 3, each prior art termination circuit 300a–300c comprises the 150 Ω pull-down resistor 130a–130c in parallel with a first clamping diode 302a–302c, and a second clamping diode 304a–304c connected between the respective RGB line 120a–120c and an analog VCC (ANAVCC) voltage source. The clamping diodes 302a–302c and 304a–304c clamp the voltage on the RGB lines 120a–120c between ANAVCC and ANAGND, and thus provide ESD protection to ASIC 100 by suppressing voltage surges. In particular, the clamping diodes prevent the voltages on the lines 120a–120c from becoming either less than one diode forward voltage drop below ANAGND, or greater than one diode forward voltage drop above ANAVCC.

One problem with the use of the clamping diodes in the prior art circuit of FIG. 3 is caused by the tendency of the clamping diodes 302a–302c and 304a–304c to approximate short circuits at high frequencies, thus effectively shorting across the termination resistors 130a–130c. Thus, care must be taken to select clamping diodes that do not exhibit this high frequency characteristic. The inventor has verified using TDR plots that, unless the correct type of clamping diode is used, a drastic reduction in the high frequency impedance can occur, resulting in a degradation in the signal quality.

Figure 4:
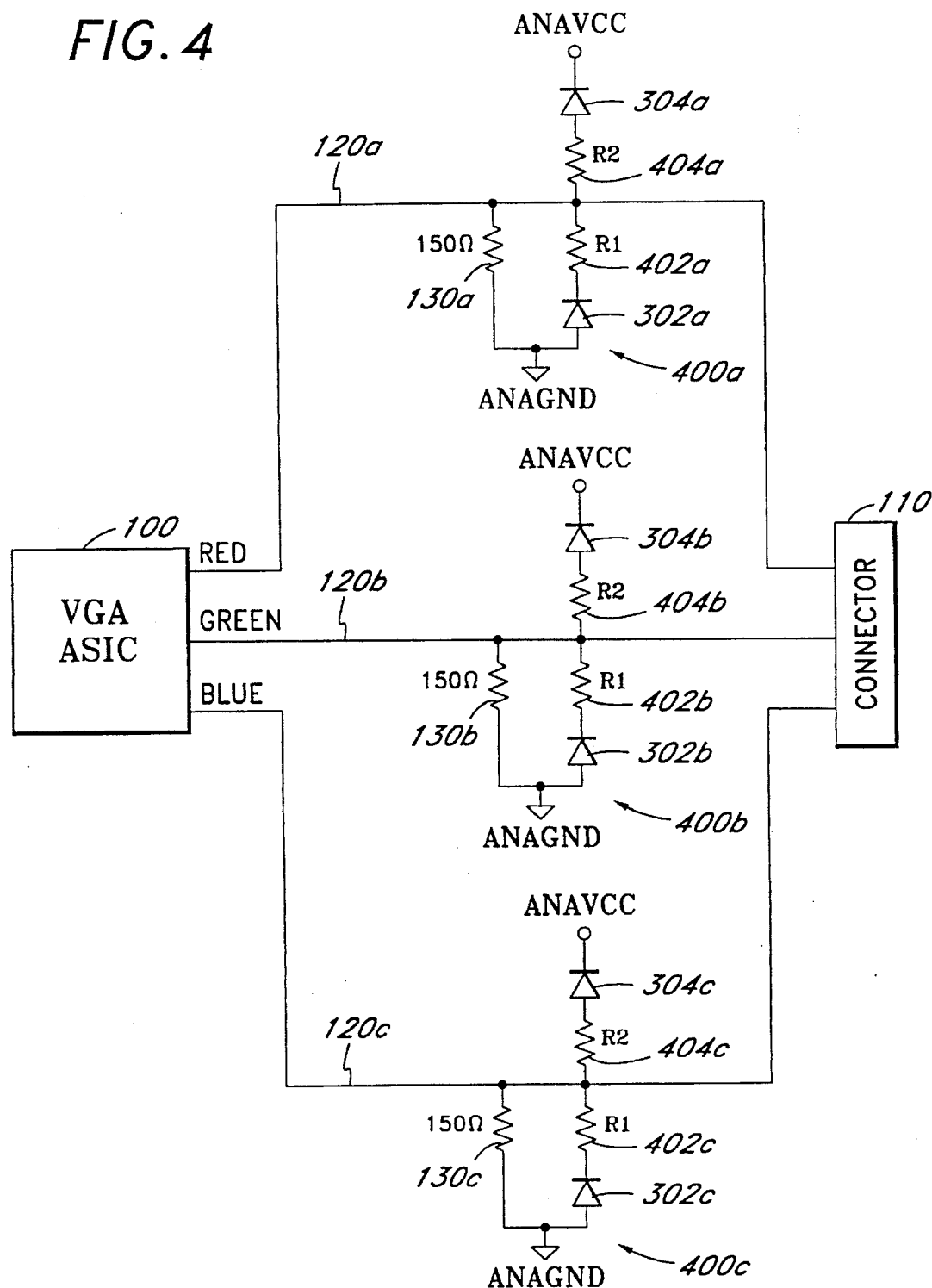
FIG. 4 illustrates an RGB termination circuit in accordance with a second embodiment of the present invention, which includes clamping diodes to provide ESD protection.

FIG. 4 illustrates the alternative embodiment of the present invention, which combines the impedance matching benefits of the FIG. 2 circuit with the ESD protection provided by the FIG. 3 circuit. A termination circuit 400a comprises a series combination of a clamping diode 302a and a resistor 402a connected between ANAGND and the red signal line 120a (in parallel with the resistor 130a), and a series combination of a clamping diode 304a and a resistor 404a connected between the line 120a and ANAVCC. A termination circuit 400b comprises a series combination of a clamping diode 302b and a resistor 402b connected between ANAGND and the green signal line 120b (in parallel with the resistor 130b), and a series combination of a clamping diode 304b and a resistor 404b connected between the line 120b and ANAVCC. A termination circuit 400c comprises a series combination of a clamping diode 302c and a resistor 402c connected between ANAGND and the blue signal line 120c (in parallel with the resistor 130c), and a series combination of a clamping diode 304c and a resistor 404c connected between the line 120c and ANAVCC. Filtering capacitors (not shown) are connected between ANAGND and ANAVCC.

The resistors 402a–402c each have a resistance of R1. The resistors 404a–404c each have a resistance of R2. The clamping diodes 302a–302c and 304a–304c are preferably of the type described above, which effectively become short circuits with respect to the high frequency signal components that are most susceptible to reflection. The prior art concern regarding the effective short across the resistors 130a–130c is eliminated by the existence of the series resistors 402a–402c and 404a–404c.

When the monitor-sense circuit of the ASIC 100 senses the monitor type, the voltages on the lines 120a–120c remain between ANAGND and ANAVCC. Thus, the clamping diodes 302a–302c and 304a–304c remain reverse biased. The series resistors 402a-402c and 404a–404c thus do not contribute to the DC resistance seen by the ASIC, and do not affect the operation of the monitor-sense circuit.

During the transmission of color signals, the clamping diodes 302a–302c and 304a–304c approximate short circuits with respect to high frequency components, effectively placing the three resistors of each termination circuit 400a–400c in parallel. Note that ANAGND and ANAVCC are effectively shorted together at high video frequencies because of the filter capacitors. Neglecting any resistance contribution RD of the clamping diodes 302a–302c, 304a–304c, the high frequency resistance is:

$$R_{HF} = \frac{150\left(\frac{(R1)(R2)}{(R1+R2)}\right)}{150 + \left(\frac{(R1)(R2)}{R1+R2}\right)} \quad (3)$$

Thus, the desired termination impedance of $R_{HF}=75\ \Omega$ can be obtained by setting R1=R2=300 Ω, or by selecting any other combination of R1 and R2 that produces $R_{HF}=75\ \Omega$ in equation (3). If the resistances of the diodes 302a–302c, 304a–304c are not negligible, then the resistances R1 and R2 should be reduced accordingly.

It should be recognized that the circuits of FIGS. 2 and 4 have applicability outside the context of VGA ASICs. The circuits can be used, for example, whenever an application requires a DC termination resistance for a transmission line that is higher than the AC impedance of the transmission line.

The circuits of FIGS. 2 and 4 exemplary embodiments of termination circuits in accordance with the present invention, and are not intended to limit the scope of the invention. Thus, the breadth and scope of the invention should be defined only in accordance with the following claims and their equivalents.

What is claimed is:

1. A termination circuit for a signal line that carries an analog color signal from an ASIC to a monitor, said ASIC having a monitor-sense circuit to sense the type of the monitor, said termination circuit comprising:

a first resistor connected between the signal line and ground, said first resistor having a resistance substantially equal to a DC termination resistance required for proper operation of the monitor sense circuit, said DC termination resistance being different from an AC impedance of the signal line; and a series combination of a second resistor and a diode, said series combination connected between the signal line and ground, said diode being reverse biased when said ASIC senses the monitor type so that said second resistor does not affect the operation of the monitor-sense circuit, said diode approximating a short circuit at high frequencies to provide a high frequency termination impedance substantially equal to the resistance of the parallel combination of said first resistor and said second resistor, said high frequency termination impedance selected to match said AC impedance of said signal line.

2. The termination circuit according to claim 1, wherein said first resistor and said second resistor, when connected in parallel, produce a parallel resistance that is substantially equal to said AC impedance of the signal line.

3. The termination circuit of claim 1, wherein said first resistor and said second resistor each have a resistance of approximately 150 ohms.

4. The termination circuit of claim 1, wherein said ground to which said first resistor is connected is an analog ground that is AC isolated from a logic ground used for digital logic circuitry.

5. A termination circuit for a signal line that carries an analog color signal from an ASIC to a monitor, said ASIC having a monitor sense-circuit to sense the type of the monitor, said termination circuit comprising:

a first resistor connected between the signal line and ground, said first resistor having a resistance substantially equal to a DC termination resistance required for proper operation of the monitor-sense circuit, said DC termination resistance being different from an AC impedance of the signal line;

a second resistor and a first diode connected in series between the signal line and ground, said first diode being reverse biased when the ASIC senses the monitor type so that said second resistor does not affect the operation of the monitor-sense circuit, said first diode approximating a short circuit at high frequencies to thereby effectively connect said second resistor in parallel with said first resistor; and a third resistor and a second diode connected in series between the signal line and a voltage source wherein said voltage source is AC coupled to ground, said second diode being reverse biased when the ASIC senses the monitor type so that said third resistor does not affect the operation of the monitor-sense circuit, said second diode approximating a short circuit at high frequencies to thereby effectively connect said third resistor in parallel with said first resistor and said second resistor to provide a high frequency impedance selected to match said AC impedance of said signal line.

6. The termination circuit of claim 5, wherein said first resistor, said second resistor and said third resistor, when connected in parallel, produce a parallel resistance that is substantially equal to the AC impedance of the signal line.

7. The termination circuit of claim 5, wherein said first resistor, said second resistor and said third resistor, when connected in parallel, produce a parallel resistance of approximately 75 Ω.

8. A method of providing a termination impedance on a signal line that matches art AC impedance of the signal line, without affecting the operation of a monitor-sense circuit of an ASIC that requires a termination resistance that differs from the AC impedance of the signal line, comprising the steps of:

providing a first resistance between said signal line and ground, said first resistance being within a range necessary for the proper operation of the monitor-sense circuit;

providing a second resistance, wherein the parallel combination of said first resistance and said second resistance has a resistance that is substantially equal to the AC impedance of the signal line; and providing a diode in series with said second resistance, said diode being reverse biased when the monitor-sense circuit senses the monitor type so that said second resistance does not affect the monitor-sense circuit, said diode approximating a short circuit at high signal frequencies to effectively connect said second resistance in parallel with said first resistance to thereby provide a high frequency termination impedance that matches the AC impedance of the signal line.

9. The method according to claim 8, wherein said diode and said second resistance are connected in series between the signal line and ground.

10. The method according to claim 8, wherein said diode and said second resistance are connected in series between the signal line and a voltage source, said positive voltage source being AC coupled to ground.

11. A method of providing a substantially constant AC termination impedance on a transmission line over a wide range of frequencies, comprising the steps of:

selecting a diode which approximates a short circuit over a range of signal frequencies, said range of signal frequencies encompassing all frequency components that are susceptible to reflection within the transmission signals provided on said transmission line;

forming a transmission line termination circuit by connecting said diode in series with at least a first resistance to form a series combination, and by connecting said series combination in parallel with a DC termination circuit; and connecting said transmission line termination circuit to said transmission line such that said diode is reverse biased when a DC voltage is provided on said transmission line.

12. The method according to claim 11, wherein said range of signal frequencies encompasses all frequency components of an RGB video transmission signal that are susceptible to reflection.

13. The method according to claim 11, wherein said first resistance is selected such that an impedance produced by a parallel combination of said first resistance with said DC termination circuit matches an impedance of said transmission line.

14. The method according to claim 13, wherein said DC termination circuit comprises a second resistance which is selected to enable a monitor-sense circuit on said transmission line to function properly.

15. A transmission line termination circuit for producing a substantially constant AC termination impedance over a wide range of signal frequencies, and for producing a DC termination impedance which differs from the AC termination impedance, the termination circuit comprising:

a first resistance and a second resistance coupled between a transmission line and a voltage reference; and a diode coupled to said second resistance such that said diode selectively switches said second resistance into and out of resistive combination with said first resistance in response to changes in signal frequencies on the transmission line, said diode thereby producing an AC termination impedance which differs from a DC termination impedance;

wherein said first and second resistances are selected such that said AC termination impedance matches an impedance of the transmission line.

16. A transmission line termination circuit according to claim 15, wherein said diode is connected in series with said second resistance.

17. A transmission line termination circuit according to claim 15, wherein said diode approximates a short circuit over a range of signal frequencies which encompasses all frequency components that are susceptible to reflection within transmission signals provided on the transmission line.

18. A transmission line termination circuit according to claim 15, wherein said voltage reference is ground.

19. A method of providing a substantially constant AC termination impedance on a transmission line over a wide range of signal frequencies, comprising the steps of:

selecting a diode which approximates a short circuit over a range of signal frequencies, said range of signal frequencies :encompassing all frequency components that are susceptible to reflection within the transmission signals provided on said transmission line; and forming a transmission line termination circuit 2 by coupling said diode to at least a first resistance, a second resistance, and the transmission line such that said diode selectively switches said second resistance into and out of resistive combination with said first resistance in response to changes in signal frequencies on the transmission line, said diode thereby producing an AC termination impedance which differs from a DC termination impedance;

wherein said first and second resistances are Selected such that said AC termination impedance matches an impedance of the transmission line.

20. A method according to claim 19, wherein said step of coupling comprises connecting said diode in series with said second resistance.

* * * * *

UNITED STATES PATENT AND TRADEMARK OFFICE
CERTIFICATE OF CORRECTION

PATENT NO. : 5,565,896
DATED : October 15, 1996
INVENTOR(S) : Edward D. Suski

It is certified that error appears in the above-indentified patent and that said Letters Patent is hereby corrected as shown below:

In Claim 8, at line 2 (column 8, line 38), "matches art AC" should be --matches an AC--;

In Claim 19 at line 6 (column 10, line 23), "frequencies :encompassing" should be --frequencies encompassing--:

In Claim 19 at line 9 (column 10, line 26), "circuit 2 by" should be --circuit by--;

In Claim 19 at line 18 (column 10, line 35), "Selected" should be --selected--.

Signed and Sealed this

Thirteenth Day of May, 1997

Attest:

BRUCE LEHMAN

*Attesting Officer*        *Commissioner of Patents and Trademarks*